(12) United States Patent
Ramm et al.

(10) Patent No.: US 10,199,804 B2
(45) Date of Patent: Feb. 5, 2019

(54) BUSBAR LOCATING COMPONENT

(71) Applicant: Tesla Motors, Inc., Palo Alto, CA (US)

(72) Inventors: Robert James Ramm, Mountain View, CA (US); Dino Sasaridis, San Francisco, CA (US); Colin Campbell, San Francisco, CA (US); Wenjun Liu, Santa Clara, CA (US)

(73) Assignee: Tesla, Inc., Palo Alto, CA (US)

( * ) Notice: Subject to any disclaimer, the term of this patent is extended or adjusted under 35 U.S.C. 154(b) by 274 days.

(21) Appl. No.: 14/557,398

(22) Filed: Dec. 1, 2014

(65) Prior Publication Data

US 2016/0156278 A1    Jun. 2, 2016

(51) Int. Cl.
| | | |
|---|---|---|
| *H02B 1/48* | (2006.01) | |
| *H02B 1/20* | (2006.01) | |
| *H02B 1/04* | (2006.01) | |
| *B60L 1/00* | (2006.01) | |
| *H01L 25/11* | (2006.01) | |
| *H02M 7/00* | (2006.01) | |

(52) U.S. Cl.
CPC .............. *H02B 1/20* (2013.01); *B60L 1/00* (2013.01); *H01L 25/115* (2013.01); *H02B 1/04* (2013.01); *H02B 1/48* (2013.01); *H02M 7/003* (2013.01)

(58) Field of Classification Search
None
See application file for complete search history.

(56) References Cited

U.S. PATENT DOCUMENTS

| | | | | |
|---|---|---|---|---|
| 5,373,418 A | * | 12/1994 | Hayasi ............... | H01L 23/4006 257/718 |
| 5,995,380 A | * | 11/1999 | Maue ................. | B60R 16/0238 174/254 |
| 7,364,449 B2 | * | 4/2008 | Makino ............... | H01R 9/226 439/212 |
| 7,499,262 B1 | * | 3/2009 | Darr .................. | H01R 9/226 361/626 |
| 7,508,668 B2 | * | 3/2009 | Harada ............... | H01L 25/072 361/689 |
| 7,679,915 B2 | * | 3/2010 | Isomoto .............. | H02M 7/003 165/185 |
| 8,441,826 B2 | | 5/2013 | Kroeze et al. | |
| 8,462,509 B2 | * | 6/2013 | Hsieh ................. | H05K 7/205 361/720 |
| 8,493,018 B2 | | 7/2013 | Kroeze et al. | |

(Continued)

FOREIGN PATENT DOCUMENTS

CN          103828501 A          5/2014

OTHER PUBLICATIONS

"Power Control: Controlling Power During Driving and Charging" by Tesla Motors, Inc., published 2012 or earlier, 3 pages.

(Continued)

*Primary Examiner* — Courtney Smith
(74) *Attorney, Agent, or Firm* — Garlick & Markison; Bruce E. Garlick

(57) ABSTRACT

A busbar locating component includes: one or more first attachments configured for attaching a busbar layer to the busbar locating component; one or more bays each configured to contain and position an assembly of transistors essentially perpendicular to the busbar layer for connection; and a plurality of slots, each slot configured to contain and position a busbar relative to the busbar layer for connection.

20 Claims, 5 Drawing Sheets

(56) References Cited

U.S. PATENT DOCUMENTS

| | | | |
|---|---|---|---|
| 8,686,288 B2 | 4/2014 | Kalayjian et al. | |
| 9,042,112 B2 * | 5/2015 | Guan | H05K 7/18 |
| | | | 361/676 |
| 9,137,932 B2 * | 9/2015 | Tokuyama | H01L 23/36 |
| 9,474,189 B2 * | 10/2016 | Kawauchi | H02M 7/003 |
| 9,661,786 B2 * | 5/2017 | Lu | H05K 7/1432 |
| 2005/0231896 A1 * | 10/2005 | Yamashita | B60R 16/0238 |
| | | | 361/600 |
| 2008/0130223 A1 * | 6/2008 | Nakamura | H02M 7/003 |
| | | | 361/689 |
| 2008/0158824 A1 * | 7/2008 | Aoki | H01L 23/24 |
| | | | 361/711 |
| 2008/0180884 A1 * | 7/2008 | Parrish | B60R 16/0238 |
| | | | 361/624 |
| 2010/0091464 A1 * | 4/2010 | Ohnishi | H01L 23/053 |
| | | | 361/723 |
| 2013/0211579 A1 | 8/2013 | Kalayjian | |
| 2013/0308362 A1 * | 11/2013 | Karlsson | H02M 7/003 |
| | | | 363/141 |
| 2014/0218862 A1 * | 8/2014 | Hashikura | B60R 16/0238 |
| | | | 361/688 |
| 2015/0289369 A1 * | 10/2015 | Sunaga | H01L 23/3735 |
| | | | 361/783 |
| 2016/0155572 A1 * | 6/2016 | Ramm | H01G 4/40 |
| | | | 361/782 |

OTHER PUBLICATIONS

State Intellectual Property Office; Search Report; CN App No. 201510742323.2; dated Jun. 15, 2018; 2 pgs.

* cited by examiner

BUSBAR LOCATING COMPONENT

BACKGROUND

Electronic devices can use a number of different types of components, including transistors or other active switching devices, diodes and capacitors, to name just a few examples. One area of electronic devices is power inverters, for example those used to convert high-voltage DC to AC for driving an electric motor (e.g., in an electric vehicle).

Designing electronic devices usually requires taking into account several competing demands and restrictions. First, the device must be designed to have the desired performance characteristics (e.g., be sufficiently powerful and effective). Second, in some applications the available space is limited, which puts a premium on creating a compact and power dense device that has proper thermal control. Third, manufacturability is a critical factor for devices intended for mass production, because the ability to automate assembly steps, and perform them quickly, directly impact the value of the device in the final product.

SUMMARY

In a first aspect, a busbar locating component includes: one or more first attachments configured for attaching a busbar layer to the busbar locating component; one or more bays each configured to contain and position an assembly of transistors essentially perpendicular to the busbar layer for connection; and a plurality of slots, each slot configured to contain and position a busbar relative to the busbar layer for connection.

Implementations can include any or all of the following features. Each of the slots has at least one releasable detent configured to hold the corresponding busbar within the slot. The busbar locating component is implemented in an inverter configured to convert DC to AC, wherein DC busbars are positioned in adjacent slots on one side of the busbar locating component, and wherein each of the bays has an AC busbar in a respective AC busbar slot. There are at least two AC busbar slots, each having an extension past an end of the respective bay, the busbar locating component further comprising a support structure that bridges respective ends of the extensions to each other. The busbar locating component further comprises one or more second attachments configured for attaching at least one circuit board to the busbar locating component, the circuit board positioned on an opposite side of the busbar layer than the bays. Each of the bays further comprises a terminal pass-through located across the bay from the corresponding AC busbar slot, the terminal pass-through configured to have at least one capacitor terminal extend therethrough from below the busbar locating component to the busbar layer. Each of the bays is defined by a sidewall, a bottom wall and an outside of an adjacent slot. The assembly of transistors in each of the bays comprises a heatsink extending essentially from end to end in the bay, each of the bays also configured to contain and position the corresponding heatsink, wherein the transistors of the assembly are positioned against the heatsink on at least one side thereof. The first attachments are configured for positioning the busbar layer across a top of the busbar locating component, wherein the transistors extend essentially perpendicularly downward from the busbar layer.

In a second aspect, a method of assembling an electronic device includes: inserting a respective busbar in each of a plurality of slots in a busbar locating component, each slot configured to contain and position the corresponding busbar relative to a busbar layer for connection; inserting an assembly of transistors in each of one or more bays in the busbar locating component, each bay configured to contain and position the transistors essentially perpendicular to the busbar layer for connection; attaching the busbar layer to the busbar locating component by one or more first attachments on the busbar locating component; and welding, after attachment of the busbar layer, the transistors and the busbars to the busbar layer after attachment of the circuit board.

Implementations can include any or all of the following features. The method further comprises attaching, after the attachment of the busbar layer, at least one circuit board to the busbar locating component by one or more second attachments on the busbar locating component. The method further comprises soldering, after the attachment of the circuit board, a lead of each of the transistors to the circuit board. The method further comprises attaching the busbar locating component and a capacitor component to each other, each of the bays further comprising a terminal pass-through configured to have at least one terminal of the capacitor component extend therethrough from below the busbar locating component to the busbar layer.

In a third aspect, an inverter includes: one or more busbar layers; an assembly of transistors; busbars; and means for containing and positioning the assembly of transistors essentially perpendicular to the busbar layers for connection, for containing and positioning each of the busbars relative to the busbar layers for connection, and for attaching the one or more busbar layers.

Implementations can include any or all of the following features. The means includes one or more bays for containing and positioning the assembly of transistors; the busbars comprise: first and second DC busbars that are positioned in adjacent slots on one side of the means, and an AC busbar in a respective AC busbar slot in each of the one or more bays; and the busbar layers comprise: a first DC busbar layer connected to the first DC busbar, a second DC busbar layer connected to the second DC busbar, and an AC busbar layer connected to the AC busbar. Each of the bays further comprises a terminal pass-through located across the bay from the corresponding AC busbar slot, the terminal pass-through configured to have at least one capacitor terminal extend therethrough from below the busbar locating component to the busbar layer. Each terminal pass-through extends essentially an entire length of the corresponding bay. The means includes (i) a first bay having adjacent thereto the AC busbar slot and the adjacent slots for the first and second DC busbars, and (ii) multiple second bays that are adjacent each other and parallel to the first bay, each of the second bays having a corresponding AC busbar in a corresponding AC busbar slot. The means is configured with a dimensionality of the adjacent slots for the first and second DC busbars driving a dimensionality of AC busbar slots for each of the second bays so that a dimensional tolerance is tighter at the adjacent slots than at each of the AC busbar slots.

DETAILED DESCRIPTION

This document describes examples of busbar locating components suitable for use in positioning busbar layers, transistors and busbars relative to each other in electronic devices. For example, a busbar locating component can serve to place transistors and capacitor terminals essentially perpendicular to busbar layers and a circuit board to facilitate the making of electrical connections, such as by welding or soldering. As another example, a busbar locating component can provide predictable tolerances for positioning of parts throughout the electronic device. As another example, a busbar locating component can provide electrical insulation, such as to comply with requirements applicable to high-voltage components in a power inverter.

Figure 1:
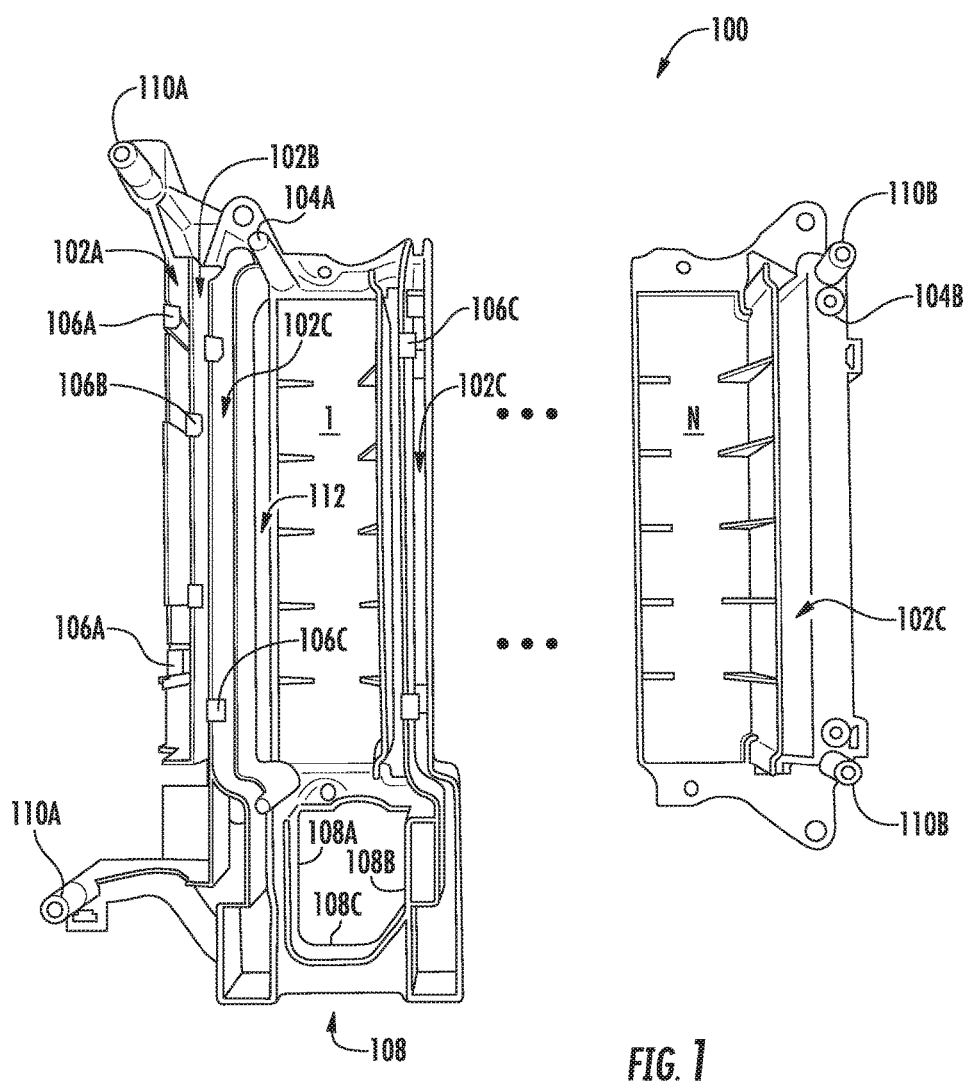
FIG. 1 shows an example of a busbar locating component.

FIG. 1 shows an example of a busbar locating component 100. The component can provide any number of bays 1 through N (N=2, 3, . . . ) for positioning electronic components, of which the first and Nth bays are illustrated here. The intermediate (zero or more) bays are here schematically indicated by ellipses.

The component has slots 102 configured to hold respective busbars for the electronic device. For example, slots 102A-B can hold respective DC busbars that are connected to a DC power source (e.g., a battery pack). One or more slots 102C, moreover, can hold an AC busbar that carries an output of the electronic device. For example, when the device is a power inverter that converts DC into three-phase AC (e.g., to drive an electric motor), the busbar locating component can have three of the slots 102C, each holding an AC busbar for one of the phases. That is, each of the bays 1 through N can have a corresponding one of the slots 102C.

The busbar locating component 100 has attachments 104A-B for attaching one or more busbar layers (not shown). For example, an attachment 104A is a tapered pin corresponding to an opening in the busbar layer. As another example, an attachment 104B comprises an opening configured to receive a fastener (e.g., a screw) inserted through an opening in the busbar layer.

Each of the slots can have a releasable detent to hold the corresponding busbar within the slot. For example, the slots 102A-C here have snaps 106A-C, respectively. Other types of detents can be used.

That is, by providing the bays 1 through N and the attachments 104A-B, the busbar locating component 100 allows the transistor assemblies to be contained and positioned essentially perpendicular to the busbar layers for connection. It also contains and positions each of the busbars (in the slots 102) relative to the busbar layers for connection.

One or more of the bays 1 through N can have an elongation at one of its ends. The elongation can include extensions 108A and 108B that are essentially parallel with the bay, and a support structure 108C that bridges respective ends of the extensions. In some implementations, the extension can provide structural protection around the end of a heatsink in the bay. For example, the heatsink can have coolant flowing through it (by way of an inlet and outlet) and the extension can then shield the inlet or outlet against mechanical damage.

The busbar locating component 100 has attachments 110A-B for attaching a circuit board (not shown). Attachments 110A near the slot 102A are here spaced further apart from each other than attachments 110B near the bay N. For example, the attachments 110A-B are positioned higher than the attachments 104A-B, relative to the bottom wall of the bay, which allows the circuit board to be positioned above the busbar layer(s).

Each of the bays 1 though N further comprises a terminal pass-through 112 located across the bay from the corresponding AC busbar slot. The terminal pass-through is configured to have at least one terminal (not shown) extend therethrough from below the busbar locating component. This allows the terminal to reach the busbar layer, thereby connecting, for example, a capacitor to the busbar layers.

The busbar locating component 100 can be used for providing predictable tolerances for the positioning of parts throughout the electronic device. To obtain good positioning of components a singular parallel tolerance stack should be defined so that the positioning of every part is driven by one master part in the assembly. Here, the busbar locating component is a solid part (e.g., made from polymer) that is manufactured in one tool (e.g., by an injection molding process) and therefore produces predictable tolerances for all other parts in the assembly.

In some implementations, the busbar locating component is designed so that the tolerance is tighter at the slots near the bay 1 than at the slots for the subsequent bays 2 through N. For example, this allows the dimensional tolerance of the DC busbar slots to drive the tolerance of the AC busbar slots that are further away on the busbar locating component.

Figure 2:
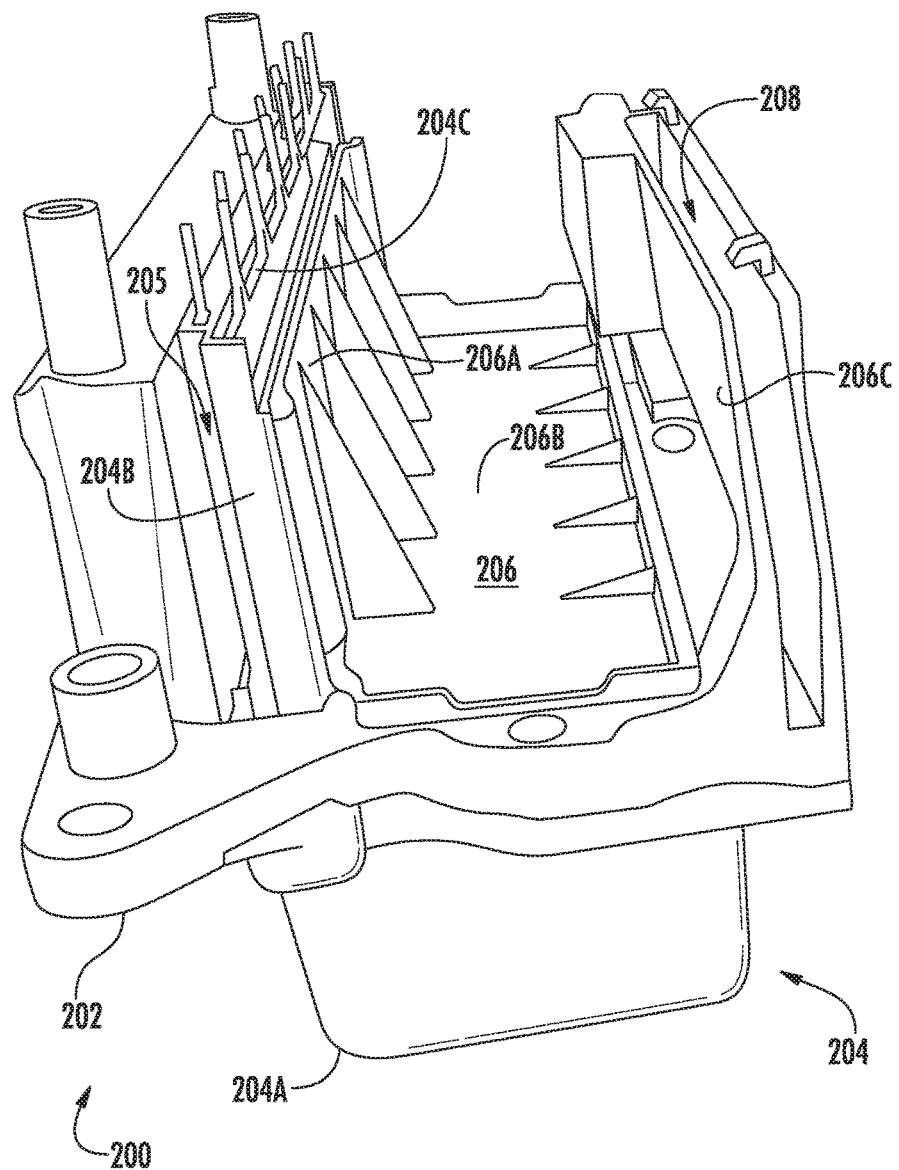
FIG. 2 shows an example of an assembly of a busbar locating component and a capacitor.

FIG. 2 shows an example of an assembly 200 of a busbar locating component 202 and a capacitor 204. The capacitor here includes a housing 204A containing capacitor conductors (e.g., foil or film), a support structure 204B extending from the housing, and relatively large planar terminals 204C that have respective leads formed at their upper edges. The busbar locating component forms a terminal pass-through 205 that accommodates the support structure and the planar terminals. In some implementations, the capacitor serves as a DC link capacitor in a power inverter.

The busbar locating component forms a bay 206 that is used for positioning a transistor assembly (not shown). The bay 206 is here defined by a sidewall 206A, a bottom wall 206B and a surface 206C. For example, the surface 206C can include be the outer surface of a slot 208 that is adjacent the bay 206.

Figure 3:
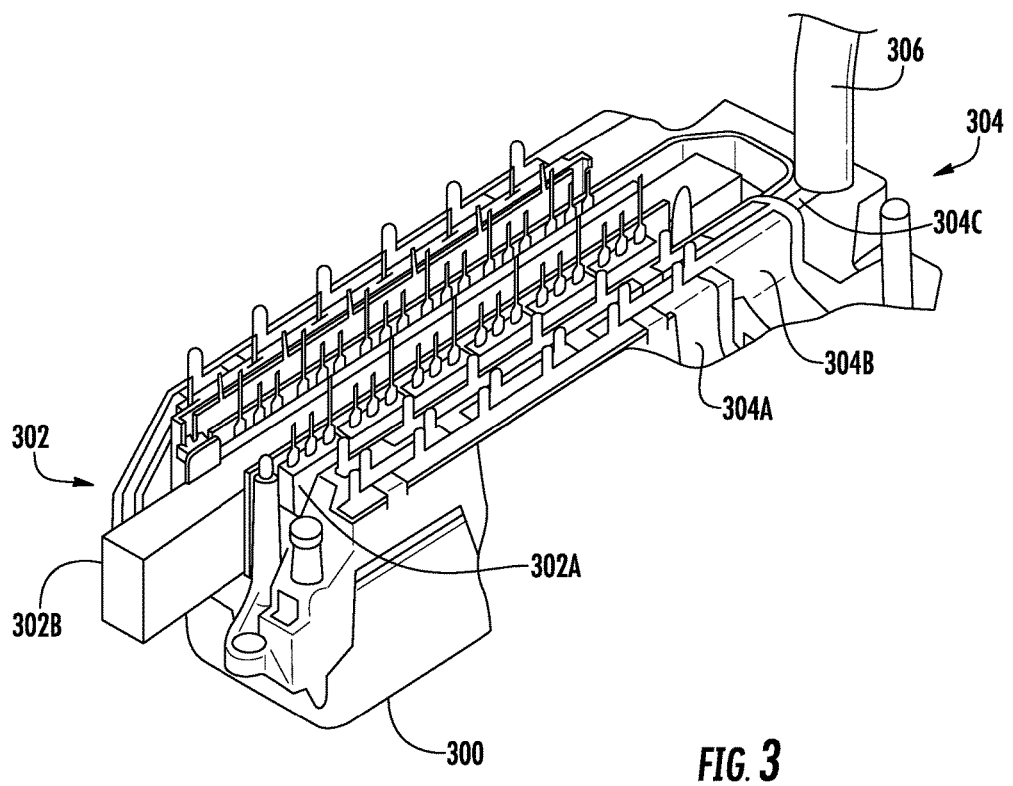
FIG. 3 shows an example of a busbar locating component with a transistor assembly and busbars.

FIG. 3 shows an example of a busbar locating component 300 with a transistor assembly 302 and busbars 304. The transistor assembly here includes transistors 302A (e.g., IGBTs) sandwiched on a heatsink 302B. The busbars here include DC busbars 304A-B and an AC busbar 304C that is connected to a wire 306 for supplying power to a load (e.g., an electric motor). Other implementations can have different numbers of busbars, including, but not limited to, having three AC busbars for outputting three-phase AC from the electronic device. The busbars are made from a conductive material, such as copper.

Figure 4:
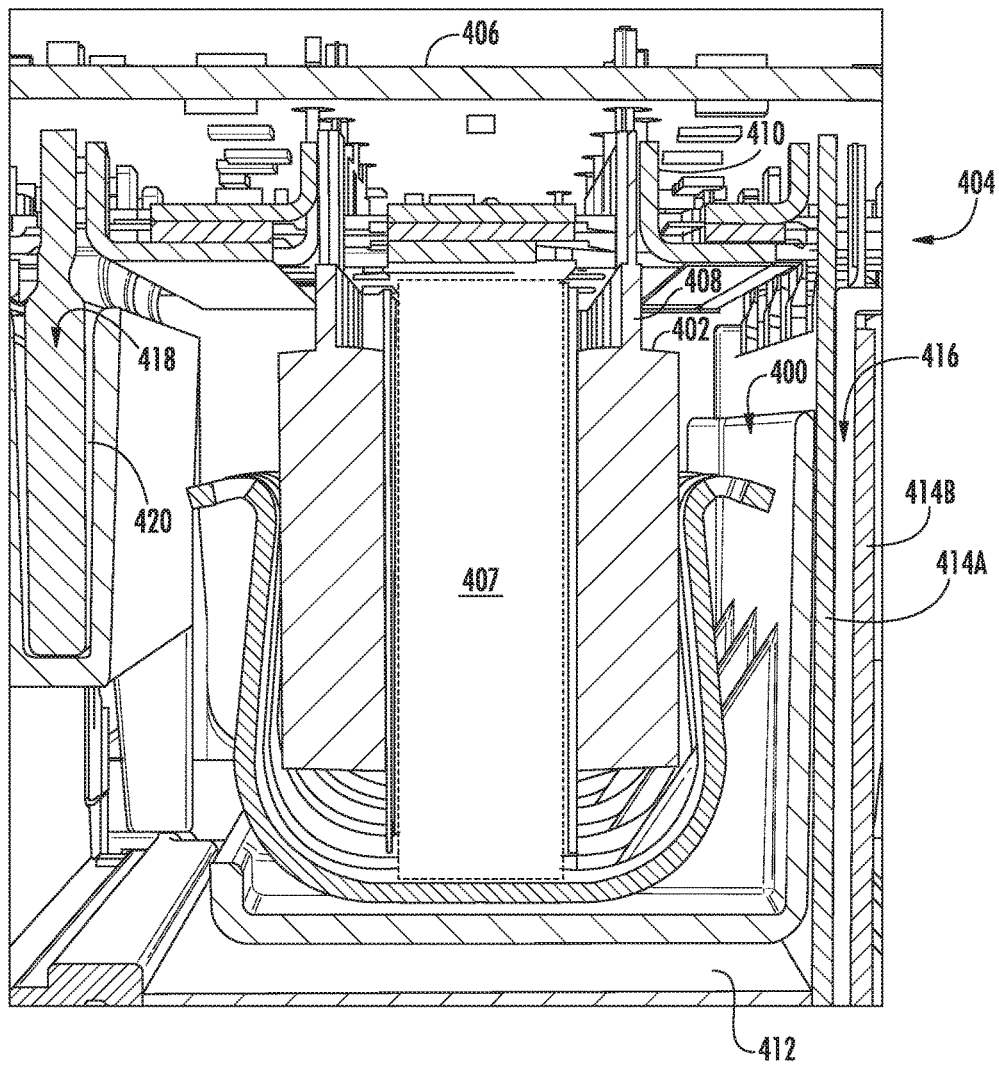
FIG. 4 shows an example of a busbar locating component with transistors, a laminate busbar structure and a circuit board.

FIG. 4 shows an example of a busbar locating component 400 with transistors 402, a laminate busbar structure 404 and a circuit board 406. Together, these components form part of an electronic device. The transistors in this example extend essentially perpendicularly downward from the busbar layers in the structure 404 and are placed on opposite sides of a heatsink 407 for thermal management. The busbar layers are made from a conductive material, such as copper. As shown in FIG. 4, transistors 402 are positioned within the bay and against heatsink 407.

The transistors have leads that connect to the circuit board 406 and/or to one of the busbar layers in the structure 404 by way of a tab 410. The transistor can connect to the circuit board either by way of the tab 410 extending onto the board, or by the lead itself reaching all the way to the board. Electrical connections can be made by welding (e.g., for high-power connections) or by soldering, to name two examples.

The electronic device also has a capacitor 412 (of which the housing is shown) with respective terminals 414A and 414B. For example, when the electronic device is a power inverter that converts DC to AC the capacitor can be a DC link capacitor. The terminals 414A-B can have respective leads or tabs at their ends. For example, this can facilitate connection of the capacitor to the busbar layers in the structure 404.

The busbar locating component 400, finally, serves to locate and position these and other components relative to each other in a way that favors efficient thermal management, allocates dimensional tolerance for reliable manufacturing, and electrically insulates parts from each other. For example, the busbar locating component defines a bay for mounting the assembly of the heatsink and the transistors 402. As another example, the busbar locating component defines a terminal pass-through 416 for the terminals 414A-B so as to position the capacitor and the busbar locating component relative to each other. As yet another example, the busbar locating component defines one or more slots 418 to help position a busbar 420 (e.g., an AC or DC busbar) relative to the other components of the electronic device.

Figure 5:
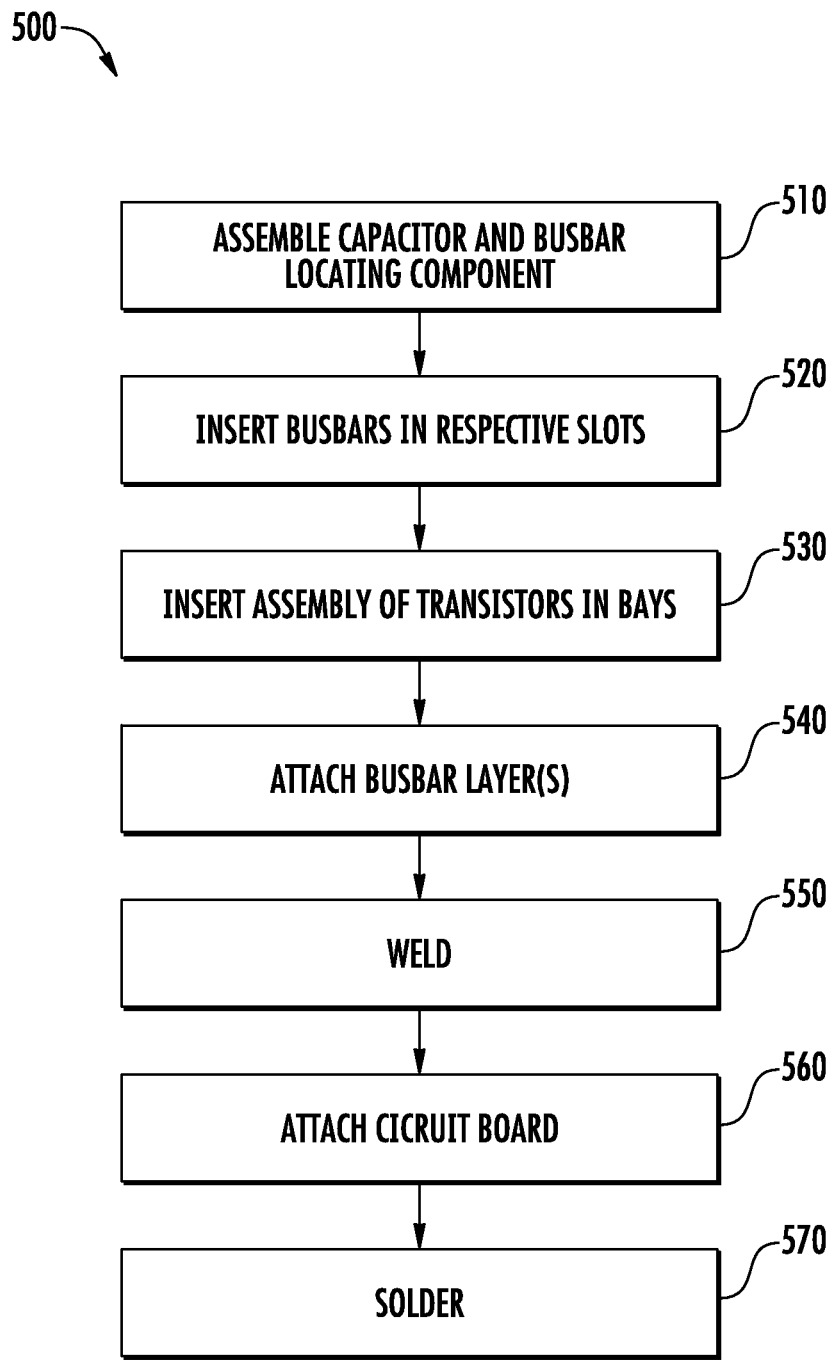
FIG. 5 is a flowchart of an example of a method of assembling an electronic device.

FIG. 5 is a flowchart of an example of a method 500 of assembling an electronic device. The method can be performed in any of a variety of contexts; here, the manufacturing of a power inverter will be used as an illustration. Some examples described herein (e.g., FIGS. 1-4) will be referred to, but the method can be performed also with other types of electronic devices. Steps can be performed manually (i.e., by a person) or robotically, or in a combination thereof. The steps can be performed in a different order unless otherwise stated or indicated.

At 510, a capacitor and a busbar locating component are assembled together. For example, the terminals 414A-B can be inserted through the terminal pass-through 416. In implementations that have multiple bays, this operation can be done simultaneously for all bays.

At 520, busbars are inserted in respective slots. In some implementations, the DC busbars 304A-B are inserted in their respective slots, and one or more AC busbars 304C are inserted in its/their respective slot(s). For example, one or more snaps can hold each busbar in place.

At 530, an assembly of transistors is inserted in each bay. For example, the transistors are mounted on a heatsink, and this assembly is then installed in the bay.

At 540, one or more busbar layers are attached. For example, the busbar layers of the structure 404 can be installed one at a time, or the structure 404 can be preassembled (with separating layers of insulation) and then installed on the busbar locating component.

At 550, welding is performed. The busbar locating component positions the workpieces to be welded in contact with, or in close proximity of, each other. For example, one or more of the leads 408 can be welded to respective tabs (e.g., the tab 410). As another example, leads from the terminals 414A-B can be welded to respective busbar layers.

At 560, a circuit board is attached. For example, the circuit board can be placed on the attachments 110A and 110B.

At 570, soldering is performed. For example, control leads of the transistors 402 that reach the circuit board can be soldered to a circuit or component on the board. As another example, the tab 410 that extends from a weld joint with one of the leads 408 can itself be soldered to the circuit board.

More or fewer steps can be performed in some implementations.

A number of implementations have been described as examples. Nevertheless, other implementations are covered by the following claims.

What is claimed is:

1. A busbar locating component comprising:
   a unitary structure formed of an electrically insulating material having:
   a first bay defined by:
   a bottom wall;
   a sidewall perpendicular to the bottom wall; and
   a surface perpendicular to the bottom wall; and
   first attachments for attaching one or more busbar layers;
   a terminal pass-through adjacent the sidewall and outside of the first bay;
   a plurality of first slots adjacent the terminal pass-through and on an opposite side of the terminal pass-through from the first bay, wherein the plurality of first slots each include a releasable detent; and
   one or more second slots adjacent the surface and outside of the first bay,
   wherein the unitary structure electrically isolates, from one another, busbars mounted within the plurality of first slots and one or more busbars mounted within the one or more second slots.

2. The busbar locating component of claim 1, wherein the one or more second slots each include a releasable detent.

3. The busbar locating component of claim 1, further comprising an elongation attached thereto, the elongation including a first extension, a second extension and a support structure attached to the first extension and the second extension.

4. The busbar locating component of claim 1, wherein the first attachments include tapered pins.

5. The busbar locating component of claim 1, further comprising second attachments for attaching a circuit board.

6. The busbar locating component of claim 5, wherein the second attachments extend higher than the first attachments relative to the bottom wall.

7. The busbar locating component of claim 1, further comprising a second bay adjacent the one or more second slots.

8. The busbar locating component of claim 7, further comprising a third slot adjacent and outside the second bay and on an opposite side of the second bay from the one or more second slots.

9. The busbar locating component of claim 8, further comprising third attachments adjacent the third slot for attaching the one or more busbar layers.

10. The busbar locating component of claim 9, further comprising fourth attachments adjacent the third slot for attaching a circuit board.

11. The busbar locating component of claim 8, further comprising a third bay adjacent the third slot.

12. A busbar locating component comprising:
    a unitary structure formed of an electrically insulating material having:
    a first bay defined by:
    a bottom wall;
    a sidewall perpendicular to the bottom wall; and
    a surface perpendicular to the bottom wall; and first attachments for attaching one or more busbar layers;

a terminal pass-through adjacent the sidewall and outside of the first bay;

a plurality of first slots adjacent the terminal pass-through and on an opposite side of the terminal pass-through from the first bay; and one or more second slots adjacent the surface and outside of the first bay, wherein the one or more second slots each include a releasable detent, wherein the unitary structure electrically isolates, from one another, busbars mounted within the plurality of first slots and one or more busbars mounted within the one or more second slots.

13. The busbar locating component of claim 12, wherein the plurality of first slots each include a releasable detent.

14. The busbar locating component of claim 12, further comprising an elongation attached thereto, the elongation including a first extension, a second extension and a support structure attached to the first extension and the second extension.

15. The busbar locating component of claim 12, further comprising a second bay adjacent the one or more second slots.

16. The busbar locating component of claim 15, further comprising a third slot adjacent and outside the second bay and on an opposite side of the second bay from the one or more second slots.

17. A busbar locating component comprising:
a unitary structure formed of an electrically insulating material having:
a first bay defined by:
a bottom wall;
a sidewall perpendicular to the bottom wall; and
a surface perpendicular to the bottom wall; and
first attachments for attaching one or more busbar layers;
a terminal pass-through adjacent the sidewall and outside of the first bay;
a plurality of first slots adjacent the terminal pass-through and on an opposite side of the terminal pass-through from the first bay;
one or more second slots adjacent the surface and outside of the first bay,
wherein the unitary structure electrically isolates, from one another, busbars mounted within the plurality of first slots and one or more busbars mounted within the one or more second slots; and
an elongation attached to the unitary structure, the elongation including a first extension, a second extension and a support structure attached to the first extension and the second extension.

18. The busbar locating component of claim 17, wherein the plurality of first slots each include a releasable detent.

19. The busbar locating component of claim 17, wherein the one or more second slots each include a releasable detent.

20. The busbar locating component of claim 17, further comprising a second bay adjacent the one or more second slots.

* * * * *